United States Patent
Pinho

(10) Patent No.: US 10,824,795 B2
(45) Date of Patent: Nov. 3, 2020

(54) INDOOR POSITIONING AND RECORDING SYSTEM

(71) Applicant: Fernando J. Pinho, Burlington, NJ (US)

(72) Inventor: Fernando J. Pinho, Burlington, NJ (US)

(*) Notice: Subject to any disclaimer, the term of this patent is extended or adjusted under 35 U.S.C. 154(b) by 0 days.

(21) Appl. No.: 15/628,700

(22) Filed: Jun. 21, 2017

(65) Prior Publication Data
US 2018/0373687 A1 Dec. 27, 2018
US 2019/0138578 A9 May 9, 2019

Related U.S. Application Data

(60) Provisional application No. 62/352,598, filed on Jun. 21, 2016, provisional application No. 62/423,349, filed on Nov. 17, 2016.

(51) Int. Cl.
| | |
|---|---|
| *G06F 40/166* | (2020.01) |
| *G06Q 10/06* | (2012.01) |
| *G06F 30/13* | (2020.01) |
| *G06F 40/14* | (2020.01) |
| *G06F 40/58* | (2020.01) |
| *G06F 40/103* | (2020.01) |
| *G06F 3/01* | (2006.01) |

(52) U.S. Cl.
CPC ............ *G06F 40/166* (2020.01); *G06F 30/13* (2020.01); *G06F 40/103* (2020.01); *G06F 40/14* (2020.01); *G06F 40/58* (2020.01); *G06Q 10/0631* (2013.01); *G06F 3/016* (2013.01)

(58) Field of Classification Search
CPC .... G06F 17/24; G06F 17/211; G06F 17/2247; G06F 3/016; G06F 40/166; G06F 40/103; G06F 40/58; G06F 40/14; G06F 30/13; G06Q 10/0631

USPC ......................................................... 715/234
See application file for complete search history.

(56) References Cited

U.S. PATENT DOCUMENTS

| | | | |
|---|---|---|---|
| 5,987,401 A * | 11/1999 | Trudeau .................. | G06F 40/58 704/2 |
| 7,571,233 B2 * | 8/2009 | Holloway, Jr. ........ | G06Q 10/06 709/227 |
| 7,587,061 B1 | 9/2009 | Pacenti et al. | |

(Continued)

FOREIGN PATENT DOCUMENTS

| | | |
|---|---|---|
| CN | 104837118 A | 8/2015 |
| WO | 2009135176 A1 | 11/2009 |
| WO | 2015113568 A1 | 8/2015 |

OTHER PUBLICATIONS

Title: Fieldwire URL: http://www.fieldwire.com/ pp. 3-4 of 41.

(Continued)

*Primary Examiner* — Andrew R Dyer
(74) *Attorney, Agent, or Firm* — Gregory J. Winsky; Archer & Greiner, P.C.

(57) ABSTRACT

An indoor recording and positioning system for use in construction projects, as well as in a host of related industries and governmental activities, which system provides for immediate and complete retrieval of construction documents, such as floorplans, blueprints, and other specifications and requirements, keyed to and calibrated by the position of the user at the construction site, and allows for the efficient and timely completion of punch lists, reports, and the like.

6 Claims, 8 Drawing Sheets

(56) References Cited

U.S. PATENT DOCUMENTS

| | | | |
|---|---|---|---|
| 7,996,555 B2* | 8/2011 | Holloway, Jr. | G06Q 10/06 709/232 |
| 8,049,762 B2 | 11/2011 | Wells et al. | |
| 8,311,510 B2 | 11/2012 | Cradick | |
| 8,434,029 B2 | 4/2013 | Albright | |
| 8,494,581 B2* | 7/2013 | Barbosa | G06Q 10/06 455/556.1 |
| 8,504,396 B2* | 8/2013 | Quintus | G06Q 10/06 700/99 |
| 8,630,840 B1* | 1/2014 | Smith | H04L 51/046 704/8 |
| 8,907,980 B2 | 12/2014 | Nielsen | |
| 8,942,727 B1 | 1/2015 | Roman | |
| 9,135,602 B2 | 9/2015 | Chegini et al. | |
| 9,225,858 B2 | 12/2015 | Anderson | |
| 9,292,583 B2 | 3/2016 | Bailiang | |
| 9,406,039 B2 | 8/2016 | Reed | |
| 9,424,545 B1 | 8/2016 | Lee | |
| 9,679,038 B2* | 6/2017 | Omansky | G06F 16/178 |
| 9,832,617 B1* | 11/2017 | Mayor | H04W 4/043 |
| 2003/0149687 A1 | 3/2003 | Brown et al. | |
| 2005/0198354 A1* | 9/2005 | Holloway, Jr. | G06Q 10/06 709/232 |
| 2007/0027732 A1 | 2/2007 | Hudgens | |
| 2007/0095887 A1* | 5/2007 | Barbosa | G06Q 10/06 235/375 |
| 2008/0071562 A1* | 3/2008 | Clemenson | G06Q 10/06 705/7.12 |
| 2009/0138353 A1 | 5/2009 | Mendelson | |
| 2009/0144097 A1* | 6/2009 | Fassio | G06Q 10/10 705/307 |
| 2009/0174768 A1 | 7/2009 | Blackburn | |
| 2009/0276273 A1 | 11/2009 | McIntosh | |
| 2009/0300525 A1* | 12/2009 | Jolliff | H04M 1/72544 715/764 |
| 2010/0174656 A1 | 7/2010 | Nolan | |
| 2010/0174803 A1* | 7/2010 | Holloway, Jr. | G06Q 10/06 709/219 |
| 2011/0261186 A1* | 10/2011 | Blackburn | H04N 1/2187 348/92 |
| 2012/0066178 A1* | 3/2012 | Omansky | G06F 16/27 707/626 |
| 2012/0221379 A1* | 8/2012 | Martinez | G06Q 10/0639 705/7.37 |
| 2012/0330852 A1 | 12/2012 | Kochevar | |
| 2013/0222069 A1 | 8/2013 | Paidimarri et al. | |
| 2014/0095119 A1 | 4/2014 | Lee | |
| 2014/0229426 A1 | 8/2014 | Gootee, III | |
| 2014/0266570 A1 | 9/2014 | Sharma et al. | |
| 2014/0278262 A1* | 9/2014 | Clemenson | G06Q 10/109 703/1 |
| 2015/0089344 A1* | 3/2015 | Pickering | G06F 40/18 715/215 |
| 2015/0168538 A1 | 6/2015 | Bradley | |
| 2015/0169791 A1* | 6/2015 | Lavrov | G06F 17/5004 703/1 |
| 2015/0193711 A1* | 7/2015 | Lavrov | G06Q 10/06313 705/7.23 |
| 2015/0193735 A1* | 7/2015 | Lavrov | G06Q 10/10 705/342 |
| 2015/0370756 A1* | 12/2015 | Steeb, III | G06F 17/30011 715/201 |
| 2016/0033652 A1 | 2/2016 | Gil | |
| 2016/0072548 A1 | 3/2016 | Shih et al. | |
| 2016/0084869 A1 | 3/2016 | Yuen | |
| 2016/0100801 A1 | 4/2016 | Clark et al. | |
| 2016/0154485 A1 | 6/2016 | Kampt | |
| 2017/0004437 A1* | 1/2017 | Clemenson | G06Q 10/109 |
| 2017/0132567 A1* | 5/2017 | Glunz | G06Q 10/101 |
| 2017/0132568 A1* | 5/2017 | Glunz | G06T 19/00 |
| 2017/0228346 A9* | 8/2017 | Steeb, III | G06F 17/211 |
| 2017/0262944 A1* | 9/2017 | Cargol | G06Q 50/02 |

OTHER PUBLICATIONS

Title: Plangrid URL: http://www.plangrid.com/ p. 12 and p. 16 of 33.
Title: Finishline URL: http://www.punchlist.net/ p. 10 of 13.
Title: FTQ360 URL: http://www.ftq360.com/ pp. 9-10 of 43.
Title: KO Punchlist URL: http://www.kopunchlist.com/ p. 9 of 19.
Title: Bluevue URL: http://www.support.bluvue.com/ Dec. 2016 pp. 7-10 of 14.
Title: Bluebeam Revu URL: https://www.bluebeam.com/us/products/revu/ Dec. 9, 2016 p. 4 of 16.
Title: Finalcad URL: https://www.finalcad.com/ Dec. 2016 pp. 14-15 of 89.
Title: Bridgit Closeout Punch List Management URL: http://www.gobridgit.com/ p. 3 of 4.
Title: Smartools URL: http://www.smartoolsllc.com/ p. 1 of 1.
Title of Article: Real-time Resource Location Date Collection and Visualization Technology for Construction Safety and Activity Monitoring Applications Authors: Tao Cheng and Jochen Teizer School of Civil Environmental Engineering, George Institute of Technology and Building Construction Management Published in: Automation of Construction; Sep. 2013, Fig 3. p. 5 of 14.
Title of Article: A GIS-Based Integrated Information Model to Improve Building Construction Management: Design and Initial Evaluation Authors: Haza Dib, Nicoletta Adamo-Villani, Raymond Issa Published in: Pursue University, Department of Computer Graphics Technology and Building Construction Management, Fig 1 (p. 773); p. 5 of 17.

* cited by examiner

INDOOR POSITIONING AND RECORDING SYSTEM

CROSS REFERENCE TO RELATED APPLICATION

This application claims the benefit of U.S. Provisional Application No. 62/352,598 filed on Jun. 21, 2016 and U.S. Provisional Application No. 62/423,349 filed on Nov. 17, 2016.

FIELD OF THE INVENTION

The present invention relates in general to systems for use in the construction projects, in the building trades and inspection businesses, and in activities that relate to using surveys, floorplans, and blueprints real property and improvements thereon.

BACKGROUND

Within the construction industry, efficient creation and implementation of quality punch lists is a process that taxes resources in terms of time, manpower, and ultimately money. Ask many contractors what is one facet of project development that needs improvement, and the punch list would consistently rank near the top. The ongoing problem in the construction industry is that there is not enough time to complete specific tasks. The problem that needs to be solved for contractors is to readily identify building errors and have the capability of solving these at a faster rate. Current practices include both traditional and nontraditional methods.

Contractors have found that one of the most time consuming endeavors are punch lists. This includes the inspection of work and identifying issues that need to be repaired and/or corrected in order to be in line with plans and construction documents, meet industry standards, and the inspector's requests, etc. These objectives are met via two employees conducting a "Walk Through" of the building with the construction documents in tow. While burdensome blueprints and other construction documents are lugged, they inspect the work completed and ensure it conforms to the plans and construction documents. The plans are viewed and remaining issues are identified while the other contractor marks them. This is usually accomplished by use of a marker or spray paint while a list is written of the items that need to be addressed. Upon completion of this "Walk Through", separate lists are prepared for each subcontractor responsible for additional work. If required, the list is translated into a different language in order to expedite the completion of the corrective work. The work is reviewed and by using plans or construction documents, these tasks are performed. The contractor will notify others when the work is completed. They will need to repeat the process of going through the building to inspect that the work has in fact been corrected. If it has all been corrected, the next facet of the construction process will be completed. The process may need to be repeated if there are items that were not addressed correctly. In many instances we are told that all of the work is done before it is in fact is completed. On occasion, subcontractors have told us that certain items were never on the original list, but were added after the initial list was submitted to the contractor. This typically happens after they lose their copy of the list.

This invention is a system that is user friendly to enable a person with limited technological expertise to use with ease. This application will be used by all team members, to maximize collaboration, and ease in the completion of tasks. This application will eliminate many or most of the concerns noted above. The ultimate goal is to reduce and/or minimize their impact on the construction schedule and the cost involved in this and future construction projects.

In its most base form, punch lists have traditionally been created utilizing two man teams. One person walks the project closely examining the environment and identifying any errors that require attention before final completion of the project. The other person writes down what is said in terms of the extent of the mistake and what is needed to rectify the problem. Moreover, the physical location of what needs to be fixed within the project is noted. That information is often in the form of a simple note pad and then passed on to the contractor and/or subcontractors to facilitate the completion/correction of the found mistakes. This is a time consuming and inefficient process that allows room for miscommunication, a lack of accountability, inaccuracy in information, and all relevant parties not being aligned.

Recognizing the inherent limitations with, and with the continued advent of technology, contractors have seen the development of various software applications. These applications focus on the aforementioned problems and create a more streamlined and accurate process. They represent an initial attempt to utilize technology to improve service delivery. Current offerings, although differing in subtle ways, share features that start the process of improving the management and completion of punch lists, including but not limited to: utilizing mobile devices to input and share data; use of voice recognition to identify and record issues that need to be fixed; creating due dates and assigning responsibility to parties with automatic overdue emails sent; sharing information to all relevant parties instantly; the ability to identify any issues found on electronic blueprints on mobile devices; and the ability to view the plans, insert photos, notes, and to collaborate with others.

In the present state of the industry, inefficiency in both time and cost is rampant in following plans and undertaking required tasks so as to complete punch lists in a timely manner. While some attempts have been made to cure these inefficiencies, such as in the system described in U.S. Pat. No. 9,424,545 to Lee designed for use in large scale construction projects, such systems lack the simplicity and cost effectiveness of the present invention. Other examples are the patent application of Gil, US 2016/0033652, geared toward a surveying system having the complexity of the use of a panoply of antennas; Kochevar's application, US 2012/0330852, dealing with repairs to facilities having fire protection systems; and U.S. Pat. No. 9,225,858 to Anderson, not applicable per se to the construction industry, but dealing with tracking locations of persons vis a vis a floor plan in a system that requires a multiplicity of electronic devices. None of the current technology provides the scope and ease of use of the present invention.

SUMMARY OF THE INVENTION

A summary of the present invention divided into the following areas:

1. Calibration for the Initial Project Set-Up of the System of the Present Invention The system allows the users to select plans, documents that are going to be used on this project that are going used for for reference in the system.

The system allows for the labeling of plans used for GPS location such as the perimeter of the second floor on the plans to be used and label as "Second Floor" as in FIG. 1A or Apartment 6 on the same plan and label it as "Apt. 6" as in FIG. 1B or each of the rooms within "Apt. 6" as in FIG. 1C. The user can repeat this for the remainder of the first floor plan (including common areas) and can repeat this process for the remainder of the building. The exterior elevations of the building can also be labeled for viewing from the exterior of the building (See FIG. 1-E). Any other drawings or documents can be incorporated in the same manner.

This invention is used to calibrate plans into program by using several points at which the building will be constructed and match each of these points to the corresponding location on a plan that has been previously downloaded such as the corners of the building on the construction site in FIG. 2A. After completing this, user can save this location in the application, and link this point to the corresponding location of the floor plan that was previously downloaded into the system. The user will be capable of finding a second; point and repeating the process. At this time the dimension between the points can be entered. These dimensions are usually available on the plans or they can be obtained by field measuring (on site). The user can locate several additional points. This process can be repeated for any applicable plans. The exterior of the building can also be "field" calibrated by selecting several points on any exterior section of the site where the building will be located. Plans can be labeled with great detail and integrated into system. In multiple story buildings, overlaying of building can be set up first, so that the user can be at any floor of that building.

In addition to this, the user has the capability of accessing the elevation of the building being viewed. For instance, there are times where a window is broken and needs to be replaced. Select that view, locate the window. Insert a comment, take a picture and send it on its way. The application will allow the user to create a rough layout of the outside of the building, as well as input various elevation options. After determining the outside boundaries of a building or property, the user will be able to input field measure of the interior walls, stairwells, doors, and windows, etc., and incorporate them into the building. The user has the ability to add more floors. The user will have the ability to copy and paste complete drawings. A rough sketch can be added to construction documents. A developer or potential real estate investor has the ability to add structures and superimpose onto site plans and similar mappings. When a user is looking at a building in which he or she is interested in purchasing or leasing, the program provides the ability to take points of reference by using GPS locations of the outside corners of the building, or the distance from one point to the other.

2. The Use of the System of this Invention in Construction Projects

Once the calibration is completed, the user can locate his position in or outside the building through the software and the relation to the plans that have been downloaded into the system. The user walks into the building, selects the area that he is going to inspect (i.e. second floor). The plan that was loaded and labeled as "Second Floor" will load into the software as in FIG. 1A. If the building only has one floor, the plans will auto load, as will the exterior elevation and any other applicable documents that correspond with the area where the user is located when the user walks outside of the building. The user can walk through the building and the icon that represents the user (see FIG. 1B) will remain constant as the plans move. This will keep the user centered in the area at which he is located at all times. The location finder, found by using the preloaded "Labeling", will keep the user informed as to his floor and his room location. The system will always keep the user centered on the screen. The user can zoom in or out, scroll, and/or select other areas on plans to look at. As the user moves, the plans are shifted so that he or she is always centered. Any other drawings or plans that have been loaded (floor joist layouts, mechanical plans, or the like) can be substituted, or overlaid, by the user, on floor plans for quick reference and/or comments. The user has the ability to move (scroll and import) plans to view areas that are not visible when where user is centered. Once location of the building has been established and saved, this can be stored and used by anyone given permission or access to the project (i.e. subcontractor, project professionals, or others). This program can also be made available to future building owners, managers, and others.

An individual that is given access can respond or comment, and will have use of the program based on the permissions given to that user. The users can have the same UPS and labeling functionality available to them. One can locate himself in relation to building or to add flexibility in being able to walk a site (in and outside the building) and comment on progress or identifying items that need to be addressed (i.e. clean-up, moving materials, open trenches, improperly completed grading). If one enters a building and selects the second floor, the application of the system will identify that the person is on the "Second Floor." The system will identify that the user is you on the Second Floor in Apartment 6, as soon as the user walks into Apartment 6 as in FIG. 1B. The user can decide to touch and add comments to the master bathroom in Apt. 6 as in FIG. 1D. The system will identify the comment as being localized to "Second Floor, Apartment 6, and Master Bathroom." The user is capable of going into greater detail and auto loading this information into reports, notification, and the like. Due to possible variances in GPS location the cursor (icon) will be the point of reference for identifying the location of the issue, and will override the location of the user as the reference point. Photos can be taken with the user's mobile device or separate camera. The user will be able to substitute different floor plans to reflect the area of the building that is being inspected and commented on. The user has the ability to complete multiple portions of the work at the same time he is walking through a building and to work on punch list for multiple recipients. The application provides the user with the ability to add photos, audio, videos, documents, and other electronic files in the same way. The user can insert comments and edit comments and the user is capable of selecting a point, select comment and you can show comment in cloud or number the point and list comments separately. Different levels of response can be added and locations can be color coordinated so that the status of a number and/or comment can be associated with a color. The user can also walk outside of the building and the program will identify that he is outside the building, and the side of the building at which he is. The program will auto load the elevations that are visible or relevant to his location for the user to view and comment in the same way as described above. The system will auto fill the location information into any report. The present system has a vertical element to the application as well, allowing the program to automatically know what floor of the structure the user is currently on, without the need to manually tell the program. Each individual site can be loaded into the database to create a virtual town, county, state, a nation or world. Adding new "sites" can be achieved by the inputting of data from existing surveys, site plans, subdivision plans, or deeds as describe above. The end result will be a map of the desired area with the individual site on it. This virtual map can be viewed in several different ways. Each user will have access to the virtual mapping of their sites. A township can incorporate a new subdivision with all the information related to it into their "town". A house can be added to each lot in the subdivision is developed. All the information associated with that house is added. Even locations of sewer water, and other utilities, if desired, can be added. Inspection can be scheduled, completed, and recorded in the same manner as noted above. The information distributed to all desired parties. Information can be added, and/or updated when the house is sold, resold, altered, etc. All the information associated with this house can be contained within this virtual lot. All employees, using the system can be tracked while completing projects for the site. Their location can be made visible to desired members of their team. This will facilitate efficient scheduling of work, and potentially reduce possible lawsuits. Employees can be tracked while working. The employee will have access to needed information related to the individual site.

BRIEF DESCRIPTION OF THE DRAWINGS

The invention will become more readily apparent from the following description of preferred embodiments thereof shown, by way of example only, in the accompanying drawings wherein.

DETAILED DESCRIPTION OF THE INVENTION

Figure 1A:
FIG. 1A is an exemplary floorplan used to construct one floor of a typical multi-floor apartment building.
Figure 1B:
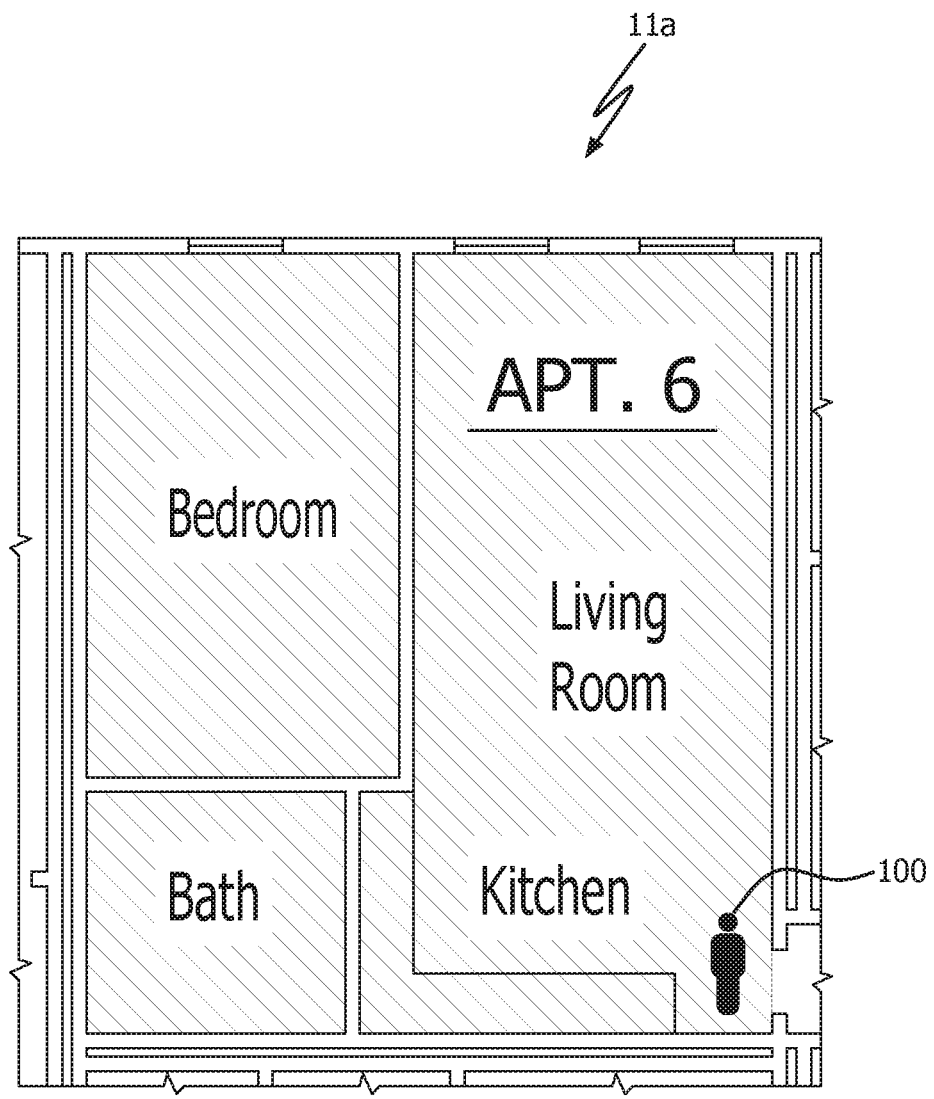
FIG. 1B is one section of the floorplan of FIG. 1A, being the floorplan for one apartment thereof, shown in the format of the electronic display of the present invention.
Figure 1C:
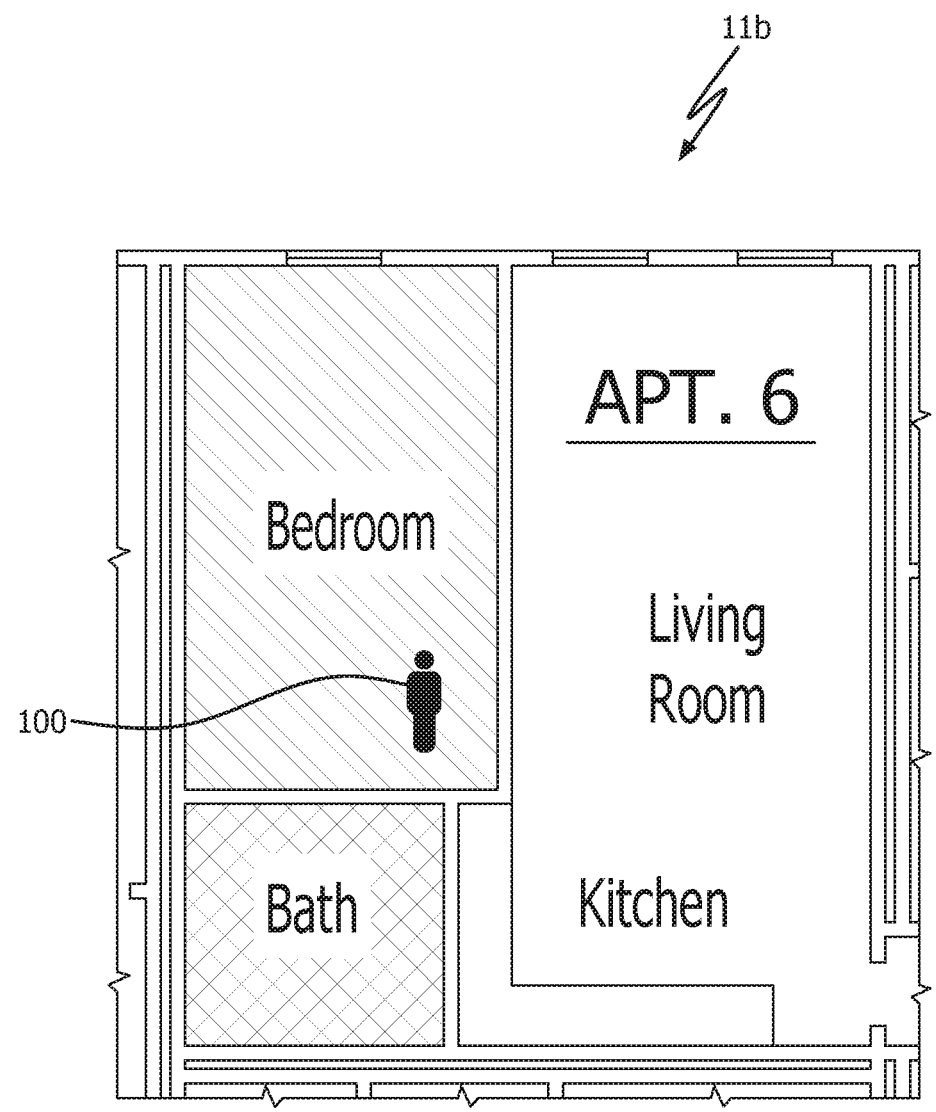
FIG. 1C shows the floorplan of the apartment shown in FIG. 1B in that format as modified by the use of the instant system.
Figure 1D:
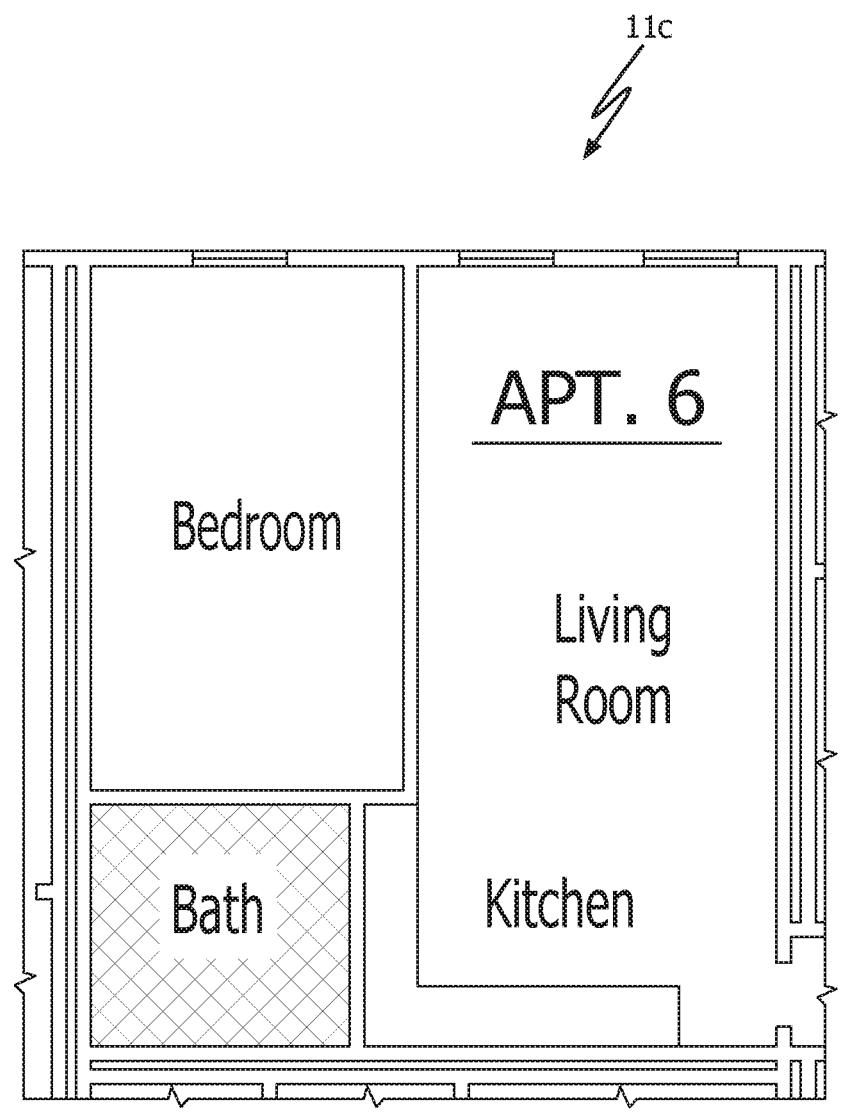
FIG. 1D shows the floorplan of FIG. 1B as modified by use of the instant system.
Figure 1E:
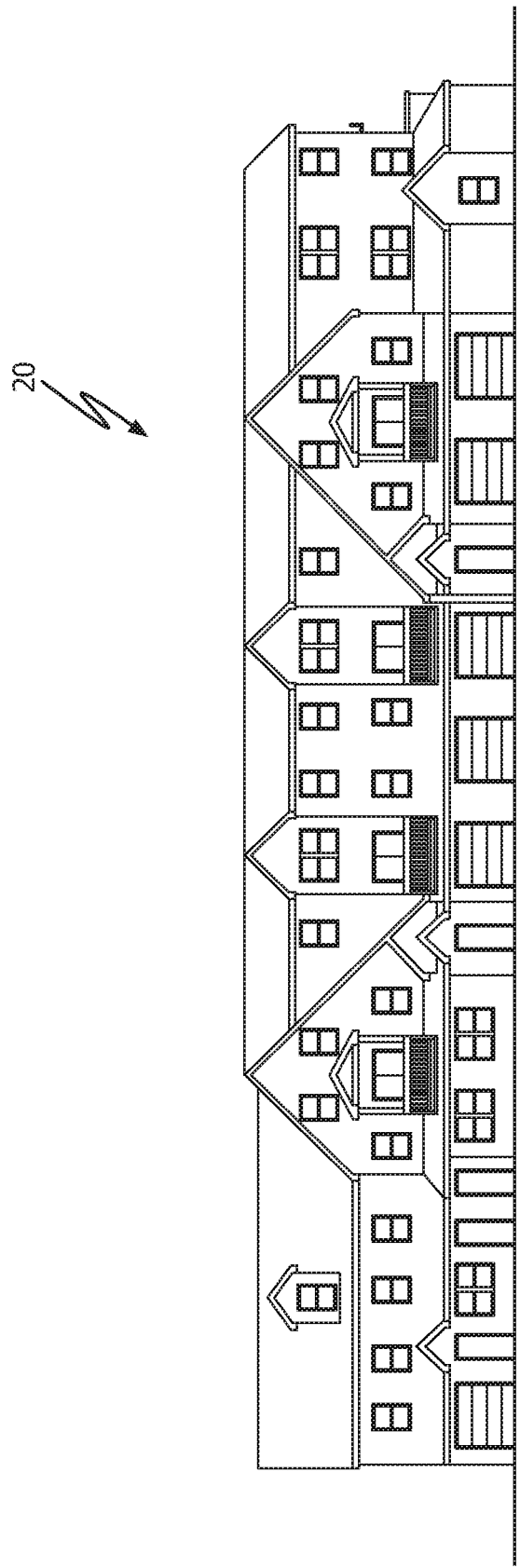
FIG. 1E is an exemplary exterior elevation of an apartment building having one floor in accordance with the floorplan of FIG. 1A.
Figure 2A:
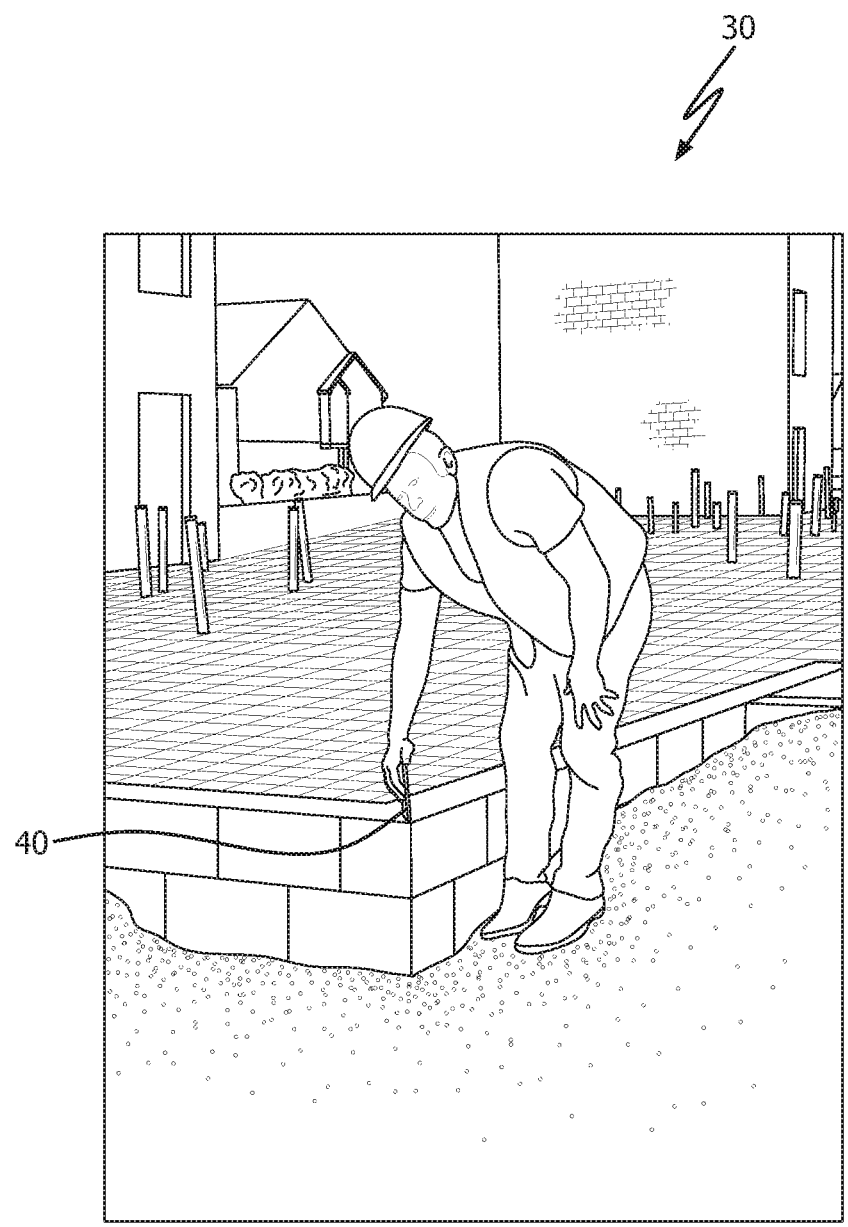
FIG. 2A shows a construction worker performing work on the construction of an apartment building of the type shown in FIG. 1E by calibrating the system of one embodiment of the present invention in the early construction of said building.
Figure 2B:
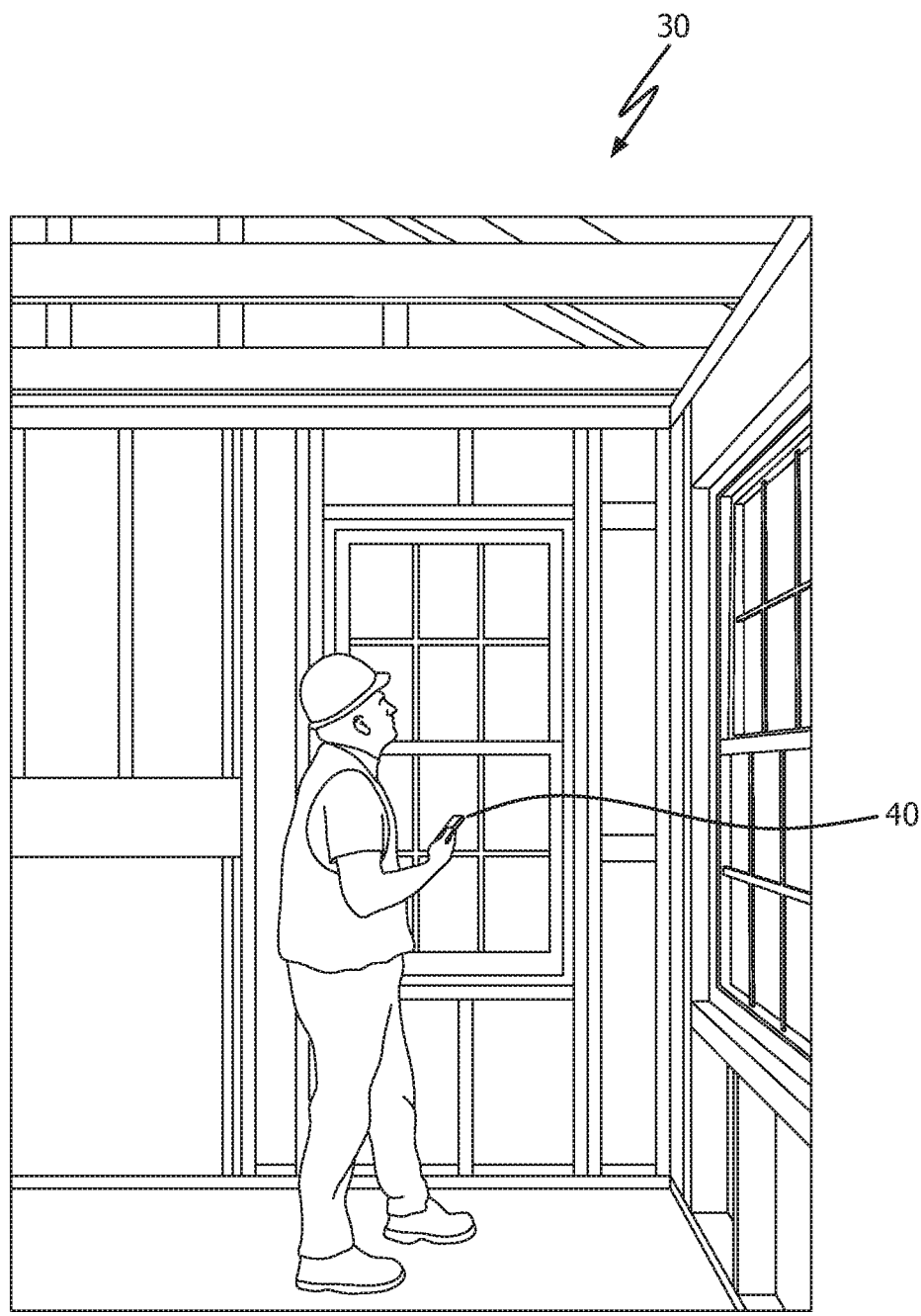
FIG. 2B shows a construction worker performing work in the later construction of an apartment building of the type shown in FIG. 1E using the system of one embodiment of the present invention.
Figure 3:
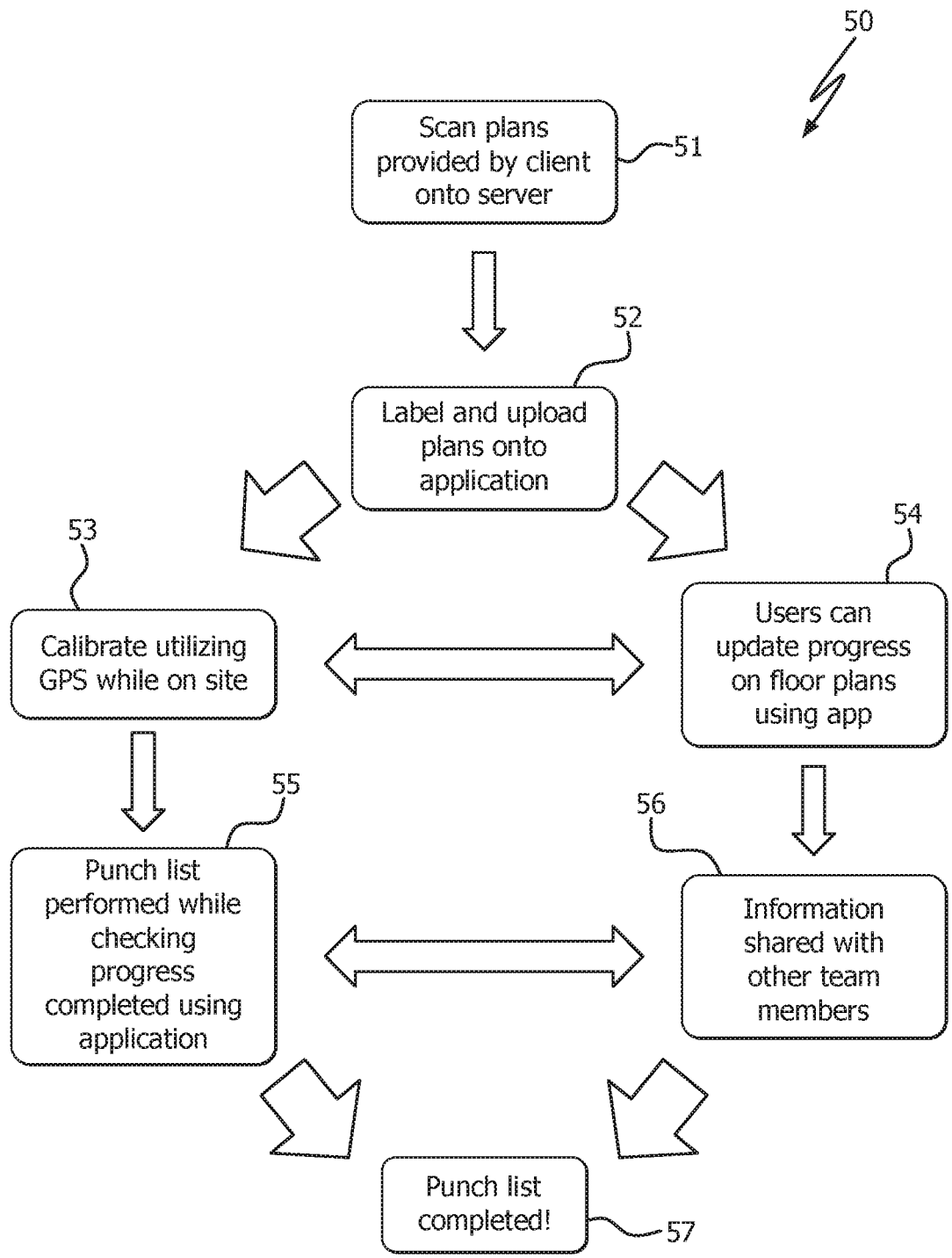
FIG. 3 is a flowchart of the method used in one embodiment of the system covered by the present invention.

The preferred embodiment of the instant invention can be appreciated by reviewing first the exemplary drawings, especially FIGS. 1A and 1E that show, respectively, a typical floorplan 10 used to construct one floor of a typical multi-floor apartment building, an exemplary exterior elevation of which being also depicted. Referring to FIG. 1A, each of the apartments being constructed on that floor can be reduced to a floorplan such as 11 labelled "Apt. 6," and as calibrated into the system and separated from the entire floorplan as 11*a* in FIG. 1B. As said Apt. 6 is being completed by the construction crew using the inventive system of this application, the electronic representation is modified in connection with the completion of, commenting upon, or changing of work to be accomplished. Examples of that progress are shown, first as 11*b* and then as 11*c*, as respectively shown in FIGS. 1C and 1D in which 11*b* and 11*c* are described in more detail below. A construction worker using the present system 40 in the calibration stage is shown in FIG. 2A performing work in the early construction 30 of an apartment building. A worker using the system after calibration is shown in FIG. 2B performing work in the later construction 30 of an apartment building of the type shown in FIG. 1E using the system 40 as described in one embodiment of the present invention. The method as used in the present system is described in FIG. 3 in the form of a flowchart 50 laying out the method used in one embodiment of the system covered by the present invention. That method 50 is further described with particularity as follows:

The system at step 51 provides a means that allows the users to select plans, documents that are going to be used on this project by scanning the documents onto a server. Input the plans, drawings layouts and other needed documents that are going used for reference in the system. Plans, documents can be input from CAD files, downloads, scanning, and the like.

The system allows for the labeling of plans in system as needed pursuant to step 52. Plans being used for location will need to be labeled in greater detail. For example, outline the perimeter of the second floor on the plans to be used and label as "Second Floor" as in FIG. 1A. Elevations for each floor can also be entered. This will help the software relate to and identify what floor the user is on (all in real time). Outline Apartment 6 on the same plan and label it as "Apt. 6" as in FIG. 1B. Outline and label each of the rooms within "Apt. 6" as in FIG. 1C. The user can repeat this for the remainder of the first floor plan (including common areas) and can repeat this process for the remainder of the building. The exterior elevations of the building can also be labeled for viewing from the exterior of the building (See FIG. 1-E). Any other drawings or documents can be incorporated in the same manner. System will have the ability to auto load documents. When an initial document is loaded, the information specific and distinguishing of the document is identified on the document (i.e. headers, names, producer of documents, recipients, titles or title boxes, symbols, addresses, page, page numbers, references, links to other pages, details, drawings, words, sections, and the like. Within that document, links to other documents, details, drawings, words, sections, etc. not in that specific document but related to that project, job, duty, and discussion. The system is taught by manually identifying and inputting information, locations, symbols, and other useful/needed information on specific document. Items being entered and taught to the system can be categorized into different categories (i.e. type of document, items and or locations within the document that identifies for example the producer, the recipients, or links created.).

Within many documents, including blueprints, links are created by identifying the symbols, letter, numbers, and pictures. Indicating and identifying the information within the symbol needed to locate the details or other information related the document or portion of the document that you are reviewing, looking at, or seeking additional information on. The application will identify the symbol, letter, number, etc. and direct you to the appropriate page(s), detail(s) or document(s) related to this item. A list of the linked information or pop-up window with the linked detail, page, document, etc. will appear when you slide your cursor over a linked item or symbol. A click of the mouse will allow the opening of the linked item in the pop-up window and maximized if needed. The next time a document that is related to one that the system has "learned from is downloaded, the system will be able to find similarities with previous documents entered, and apply the information required or requested that it has learned from the previous document to the new document so that the sender, recipients, project name and location, pages, and links will all be applied. The document can be automatically delivered or placed in the correct project and folder. Access will be given to the recipients, author and any other team member requiring access.

The system will first identify type of document to find similarities (i.e. blueprints, specifications, requests for information, submittals, images, sketches, etc.). The system will always look for the author or creator of the document first and identify the most recent versions of any document related to the project for inputting and matching for a new document. The system will go through documents from newest to oldest with a specific project and then newest to oldest for similar projects until all the required information needed has been applied to the document. This will reduce inconsistencies as documents and their authors evolve. Any information that the system cannot find or has difficulty matching can be entered manually for the document as described above. When all of the desired information has been, it is added to the database for that type of document, author, etc. The database will be able to identify information and locations within documents by learning from similarities between documents of the same type and/or from the same author. The actual documents that the identifying and linking information is being retrieved from will not be made available to the user of the document being entered unless they are the original author, a recipient, or authorized to have access to the document. The database will be available for document recognition anytime a new user is given access to the system. A new user can input a document, or set of plans and have any requested information auto loaded, and links created without striking a key of with minimal inputting. The database will have access to all documents downloaded within the system from all users for the inputting of the user's document. The information is easily incorporated into the project and made available for all team members. System can also incorporate documents being added to ongoing and existing projects in the same way.

Calibration of plans into program in step 53 is accomplished by using several GPS points at which the building will be constructed and match each of these points to the corresponding location on a plan that has been previously downloaded. (i.e. located the southeast corners of the building on the construction site) as in FIG. 2A. After completing this, user can save this location in the application, and link this point to the corresponding location of the floor plan that was previously downloaded into the system. The user will be capable of finding a second, point and repeating the process. At this time the dimension between the points can be entered. These dimensions are usually available on the plans or they can be obtained by field measuring (on site). The user can locate several additional points. This process can be repeated for any applicable plans, drawings, etc. The exterior of the building can also be "field" calibrated by selecting several points on any exterior section of the site where the building will be located. Building/Plans can be labeled with great detail and integrated into system. In multiple story buildings, overlaying of building can be set up first, so that the user can be at any floor of that building.

In addition to this, the user has the capability of accessing the elevation of the building being viewed. For instance, there are times where a window is broken and needs to be replaced. Select that view, locate the window. Insert a comment, take a picture and send it on its way. The application will allow the user to create a rough layout of the outside of the building, as well as input various elevation options. After determining the outside boundaries of a building or property, the user will be able to input field measure of the interior walls, stairwells, doors, windows, etc., and incorporate them into the building. The user has the ability to add (copying) more floors. The user will have the ability to copy and paste complete (saved) documents/drawings, or parts of documents/drawings. A rough sketch can be saved, added to, sketches, and construction documents. A developer or potential real estate investor has the ability to add structures and superimpose onto site plans, google earth, and similar mappings. When a user is looking at a building in which he or she is interested in purchasing or leasing, the program provides the ability to take points of reference by using GPS locations of the outside corners of the building, or the distance from one point to the other.

Once the calibration is completed in step 53, the user can locate his position in or outside the building through the software and the relation to the plans that have been downloaded into the system. The user walks into the building, selects the area that he is going to inspect (such as the Second Floor 10). The plan that was loaded and labeled as "Second Floor" will load into the software as in FIG. 1A. If the building only has one floor, the plans will auto load, as will the exterior elevation and any other applicable documents that correspond with the area where the user is located when the user walks outside of the building. The user can walk through the building and the icon that represents the user 100 in FIG. 1B, shown entering 11, that is Apt. 6, will remain constant as the plans move. This will keep the user centered in the area at which he is located at all times (not shown). The location finder, found by using the preloaded "Labeling", will keep the user informed as to his floor and his room location. The system, using GPS, will always keep the user centered on the screen. The user can zoom in or out, scroll, and/or select other areas on plans to look at. As the user moves, the plans are shifted so that he or she is always centered. Any other drawings, plans, etc. that have been loaded (floor joist layouts, mechanical plans, etc.) can be substituted, or overlaid, by user, on floor plans for quick reference and/or comments. Any plans or documents downloaded can be used in the same manner as described above. Plans can also be downloaded for reference. Plan, documents, and the like can be added into systems while the project is ongoing (after the initial calibration). The user has the ability to move (scroll and import) plans to view areas that are not visible when user is centered. Once location of the building has been established and saved, this can be stored and used by anyone given permission or access to the project such as a number of subcontractors or other project professionals. This system can also be licensed or in other ways made available to future building owners, managers, and others.

An individual that is given access can respond or comment, and will have use of the program based on the permissions given to that user as in FIG. 1C which shows the user 100 in the bedroom area of 11b Apt. 6 having a modified screen display. The users can have the same GPS and labeling functionality available to them. One can locate himself in relation to building or to add flexibility in being able to walk a site (in and outside the building) and comment on progress or identifying items that need to be addressed (i.e. clean-up, moving materials, open trenches, improperly completed grading). If one enters a building and selects the second floor, the application of the system will identify that the person is on the "Second Floor." The system will identify that you are on the Second Floor in Apartment 6, as soon as the user 100 walks into Apartment 6 as in FIG. 1B. The user can decide to touch and add comments to the master bathroom as shown by the crosshatching of the "Bath" area in 11c, that is Apt. 6 as in FIG. 1D. The system will identify the comment as being localized to "Second Floor, Apartment 6, and Master Bathroom." In this way, step 54 is accomplished as users update progress on floor plans. As items on the punch list are addressed, step 55 of the system is reached. The user is capable of going into greater detail and auto loading this information into reports, notification, and other communications to team members as countenanced by step 56. Due to possible variances in GPS location the user cursor (icon 100) will be the point of reference for identifying the location of the issue, and will override the location of the user as the reference point. Photos can be taken with your mobile device or separate camera. The user will be able to substitute different floor plans to reflect the area of the building that is being inspected and commented on. The user has the ability to complete multiple portions of the work at the same time he is walking through a building and to work on punch list for multiple recipients. The application provides the user with the ability to add photos, audio, videos, documents, and other electronic files in the same way. The user can insert comments and edit comments and the user is capable of selecting a point, select comment and you can show comment in cloud or number the point and list comments separately and/or audio. Different levels of response can be added and locations can be color coordinated so that the status of a number and/or comment can be associated with a color. The user can also walk outside of the building and the program will identify that he is outside the building, and the side of the building at which he is. The program will auto load the elevations that are visible or relevant to/from his location for the user to view and comment in the same way as described above. The system will auto fill the location information into any report. The present system has a vertical element to the application as well, allowing the program to automatically know what floor of the structure the user is currently on, without the need to manually tell the program.

In varied embodiments of the system, the following features can be found: Comments can be generated for multiple recipients at the same time and sent to the appropriate recipients with one push of the button; the user can point to the location on which plans comments have been added; the user has the capability of adding photos, and any other documents, voice recordings, and voice-to-text explanation and the recording can be sent to the selected recipients; voice recordings can automatically be converted to text for proofing and/or sending to recipient; text can be converted from and to other languages, if needed; the system can also be set up in different languages to accommodate the user, while all incoming text will be displayed in the preset language; each user can access documents (details, scopes, submittals, etc.) to ensure quick verification of work completed, and comment when necessary; a user can comment on any discrepancies and dispatch it to the responsible person as in the use of the system by the worker in FIG. 2B; any list of comments will be directly sent to certain recipient; documents can be attached directly to comments (such as photos, shop drawings, or other details); when user slides over the number (comment), window will appear showing comment and any attachments; comments can be sent to one or more recipients; comments can be responded to on an individual comment basis or grouping basis; comments can be responded to from one of the recipients or multiple recipients; the system will have the ability to store a complete history of all tasks, comments, and responses; filters are available to allow for only the viewing of information desired by or pertinent to the viewer; the user can require deadlines to comments or requests in the number of hours or days to respond and the system will keep the user apprised of status of requests, punch lists, and comments sent; the system can provide automatic reminders to all users of due dates; the completed file/link can be sent via email; recipients can view, in the field if necessary, using their computer or mobile device and respond in same way as initially sent out; respondents can send additional attachments, if needed; viewing and/or printing and sending of updated documents can also be associated or related to the status/color; and documents can also be printed or delivered electronically. By using these features of the system, the punch list for the project is finally, and efficiently, completed as step 57 is attained.

The system is capable of integration with programs such as the AUTOCAD® program, among others, to import drawings directly. By having access to programs such as these, this provides the user ability to move within a 3D drawings, and overlay with electronic maps and google earth are available.

Unlike the use of pen and paper, utilizing a GPS application will enhance quality, productivity, and save time on future projects. The purpose of having a GPS module is to assist project associates to correct problems before they actually occur. Likewise, this module will give an employee the access to have a better understanding of what is being viewed. The GPS application will benefit an employee if they make a mistake by demonstrating what they missed or the subcontractor who has to complete the work. Another significant advantage in having the GPS assisted system is the ability of a user to move from page to page on each plan. This can be simply performed by uploading the plans on the application that is labeled job specific.

An additional benefit of the GPS input is that this can enhance communication on site to the office and other team members. Consequently, users can upload a document or plan that is job specific and have the ability to comment on what work was performed. This application can correct any discrepancies and avoid others that the employer has with subcontractors in relation to the work completed or yet to be completed. Nevertheless, this will benefit the employer when it pertains to receiving invoices for work completed. This application will allow users to sign off work completed by other trades and instantly report back to office personnel.

To further increase the efficiency of the application, the icon representing the user 100 will be continuously centered on the device screen as they move around the structure. Stated another way, the software will automatically depict where the user is in relation to the blueprints/plans. As the user moves, so too will the blueprints/plans. Once any notations/corrections are loaded into the program, they will be localized to specific floors and rooms, in addition to the structure as a whole. The result is that when it is time to fix the problem, the end user will be able to search the structure as a whole, specific floors, or even specific rooms, all as their needs dictate.

The ultimate goal of the UPS application is to both significantly reduce the amount of time spent at the project site, as well as improve the efficiency and quality of making any necessary corrections to problems created during construction. Punch lists are completed as per step 57 in a timely manner and efficiently under budget. It should be appreciated that the preferred embodiment of the instant invention is exemplary and that other embodiments, and other uses, of this invention are intended to be covered by this application for letters patent.

The location of a parcel of land or a subdivision can be established in the system. This can be done by entering latitude and longitude coordinates and dimensions supplied by a surveyor using the system. This system can again be used should that parcel be subdivided or split into more parcels. The parcel can be updated in the system when a sub-division plan is filed with the township. As revisions or updated to this sub-division plan are submitted, the new data is uploaded into the system. The location of a structure, along with the plans for the structure, can be added to a parcel of land using the system when plans are submitted for permits to an authority.

The system will be able to track, among other things, properties that are vacant or abandoned, and the condition of such properties. A mapping of the city, town, county, state, and country will begin to take shape as more parcels are added. All the information associated with each parcel, each building, each residence, and each unit can be stored within a database which will be linked to the mapping. The information stored can be limitless.

Information regarding construction of the structure, such as plans, deeds, owner's information, tax information, and insurance information can be stored in the system. Public safety information can also be stored, such as locations of pipelines, construction details, and plans for fighting fire or other safety plans. An example of the use of the system for safety concerns is as follows: An officer responds to a call. As he drives he is able to turn the system on and, like the navigation system in the car, a mapping of the area through which he is traveling will be shown on the screen so that he can get all information on any of the parcels, buildings, residences, or units by clicking on a designated area. He can scroll or search for parcels, buildings, residences, and units that are not visible on his screen. When he arrives at the call, he can readily access the site or building plans to familiarize himself with the building prior to entering. The officer can also be equipped with the Indoor Positioning and Recording System of the current invention as a handheld unit to give him real time knowledge of the location of all personnel in the building who are using the system. This will allow for the best use and deployment of resources. This system may be incorporated into body cameras. This will also allow for a visual of the situation. This will protect the officers from harm and help to bring life threatening situations to a peaceful resolution. A fire fighter will have access to the plans along with site and building characteristics of a building on fire. The firefighter will know the layout of the building, and for example know the construction particulars of the roof of the building before stepping out on the roof.

This system helps building inspectors in the performance of their inspections. Inspections can be fast tracked with the inspector being able to forward the results of his inspection directly to the appropriate authorities. Inspection forms will be automatically populated and the inspector will be able to move within building with access to building information in real time. This gives the inspector the ability to get feedback from the authorities to whom the information is sent without delay. The system can be made to automate the scheduling of inspections, along with the permit applications, approval timing, and the invoicing process on line or by phone to reduce time office personnel spend dealing with these items.

The system is updated when there is a change of ownership of a parcel or a building. This system can also be used by a city, town, county, state, or country to track abandoned or uninhabited properties. With its ability to provide detailed inspection reports, the scheduling of follow-up inspections and eventually the condemning of such properties can be streamlined.

The system can be integrated into home business security systems. Motion detectors, glass break sensors, and surveillance cameras can be augmented with the system's ability to provide the location all persons using the system to be identified and guided by a dispatcher to avoid danger.

This system can be configured to help the infirm and the elderly who are living alone. The system adds value to existing Emergency Alert Systems by allowing the emergency response center to access the exact location of an elderly person in extremis which can be a life saver.

This system used with security cameras will allow for dispatchers to monitor an emergency situation so as to direct persons at risk or responders. An example follows: in the case in which a group of armed men enter a school and the alarm is activated. All persons that are using the instant invention are notified on their cell phones that the alarm has been activated (by text by the cell phone in silent mode). The situation can be monitored by the dispatcher, always knowing the location of the systems user with access to the cameras. The dispatchers can advise the user as the events unfold and recommend a course of action.

This system can also be used by an organization to monitor the location of the user of the system described herein. This system can be used to schedule and track the user and tasks being performed by the user. It can be used for verification of hours worked, including those worked on an each individual task.

The application can be used to input the location of any new structures that are being built or require building permits by using available plans or surveys. Existing structures can be added to the system. This can be done by using plans or surveys that are on file with the municipality or county. Existing structures can also be added by inspection of the structure and field calibration and inputting of pertinent information relating to the structure. The size of the building, location of windows, doors, stairwells, and elevators can be added. Information that is needed in case of emergency, such as construction of floors, walls, and roofs can be added to the system. The end result is a drawing of the structure that the application can access. This information about the structure can be overlaid on a virtual map of the desired area. This will allow for a map of the area that shows the location of each individual structure and allow for the icon of any desired individual user to be incorporated. Vacant properties can be identified. Budgeting, management of properties, tracking of employees, scheduling tasks, invoicing, and even paying bills can be managed through this system.

In addition to use in an emergency situation, school districts would also be able to utilize the program for facility management purposes as well. Facilities management is a huge task for school districts. The system can be used to designate, track, and evaluate work that needs to be completed.

Police dispatchers using the system will know where each law enforcement officer is at all times. When receiving a call an officer will have instant access to the layout of the house he is about to enter. This gives him an advantage about his surrounding before he even leaves his car. He can track himself and others at the scene. The officer knows where his team members are. He knows if they are on the first of second floor.

The instant system can be a platform to build upon for many uses. Each platform will have the GPS capabilities described above. Modules can be added to this platform to meet the needs of the user. Modules can be industry or user specific. This will be a platform that can handle the day to day operations of the user at both the individual level and at the administrative level.

The system can be used to create a what might be referred to as a "radius," which is located from a center point and creating a radius around it and labeling this area using GPS information. The user is identified and his location noted any time a report is produced or an item is delivered. A radius can be within a building or anywhere outside of a building, for example, to identify a trailer or storage yard. In this way, the system can confirm that someone is actually at the trailer taking a delivery and checking the items into the trailer, or to track the actual time spent by a user on individual project, or to schedule and track deliveries or tasks being completed by a user within the radius. A radius can be created around a project, a town, or even a state. Structures and locations on a site can be identified and radiuses created so that the system can timestamp when and where reports are created and show location on site where the report was created. This system has the ability to interact with other software for project management, for example, to verify materials delivered to a site that have been timestamped and the location of the user identified. Additionally, punchlists can be timestamped in the system.

Using this system will benefit employees by giving them a significant advantage to move from page to page on each plan. This can be simply performed by uploading the plans on the application that is labeled job specific.

An additional benefit of the application is that this can enhance communication on site to the office and other team members. Consequently, users can upload a document or plan that is job specific and have the ability to comment on what work was performed. This application can correct any discrepancies and avoid others that the employer has with subcontractors in relation to the work completed or yet to be completed. Nevertheless, this will benefit the employer when it pertains to receiving invoices for work completed. This application will allow users to sign off work completed by other trades and instantly report back to office personnel.

To further increase the efficiency of the application, the icon representing the user will be continuously centered on the device screen as they move around the structure. Stated another way, the software will automatically depict where the user is in relation to the blueprints or plans. As the user moves, so too will the blueprints or plans. Once any notations or corrections are loaded into the program, they will be localized to specific floors and rooms, in addition to the structure as a whole. The result is that when it is time to fix problems the end user will be able to search the structure as a whole, specific floors, or even specific rooms, as needed.

The system can significantly reduce the amount of time spent at the project site, as well as improve the efficiency and quality of making any necessary corrections to problems created during construction.

What is claimed is:

1. A method for completing a punchlist for a construction project comprising the steps of:
scanning floor plans and a punchlist into a server running under the control of an application program;
labelling said scanned punchlist and floor plans by said application program;
uploading said scanned and labelled punchlist and scanned and labelled floor plans into said application program;
calibrating said scanned and labelled punchlist and plans with positioning information by said application program;
presetting a default language for each of a plurality of handheld electronic mobile devices having indoor positioning capability and wireless capability,
sending said calibrated punchlist and floor plans wirelessly to each of said plurality of handheld electronic mobile devices each of which being programmed to accept the entering of construction progress information remotely at the indoor construction jobsite by members of said construction team in said preset default language;
calibrating each of said punchlist and floor plans with positioning information resident in each of said mobile devices;
recording progress of said indoor construction project by team members entering construction progress information into said mobile devices, which information is entered by each of said team members in his or her own preset language;
recording the completion of construction project tasks as reported by said team members in said punchlist; and
checking said punchlist to determine whether said project has been completed.

2. The method of claim 1 in which said preset languages are selected from a group comprising: English, Spanish, French, Italian, and German.

3. The method of claim 1 in which said construction team members are selected from a group comprising: managers, employers, employees, construction workers, contractors, and owners.

4. A multilingual system for remotely recording information relating to the completion of a punchlist for a construction project by construction team members comprising:
a plurality of handheld electronic mobile devices each having indoor positioning capability and wireless capability, each of which being programmed to store construction progress information remotely at the construction project in a preset language;
at least one electronic scanning device; and
at least one computer having wireless capability connected to said scanning device, said computer running an application program that uploads a punchlist scanned by and floor plans scanned by said electronic scanning device into said computer, labels and calibrates said punchlist and said floor plans with indoor positioning information, connects said computer wirelessly to said mobile devices, downloads said scanned and labelled punchlist and floor plans to each of said mobile devices wirelessly based on said team member's positioning at said construction project, and uploads into said computer construction progress information related to said team member's construction work or observation of the progress of said construction work at said positioning at said construction project in said team member's preset language as entered into said team member's mobile device, processes said recorded uploaded progress information, and enters said progress information into said punchlist until its completion.

5. The system of claim 4 in which said preset languages are selected from a group comprising: English, Spanish, French, Italian, and German.

6. The system of claim 4 in which said construction team members are selected from a group comprising: managers, employers, employees, construction workers, contractors, and owners.

\* \* \* \* \*